United States Patent [19]

Hitotsuyanagi et al.

[11] Patent Number: 5,310,704
[45] Date of Patent: May 10, 1994

[54] METHOD OF MANUFACTURING SUPERCONDUCTIVE CONDUCTOR

[75] Inventors: Hajime Hitotsuyanagi; Kazuo Sawada; Kengo Ohkura; Yoshihiro Nakai; Kazuhiko Hayashi, all of Osaka, Japan

[73] Assignee: Sumitomo Electric Industries, Inc., Osaka, Japan

[21] Appl. No.: 845,824

[22] Filed: Mar. 6, 1992

Related U.S. Application Data

[63] Continuation of Ser. No. 170,205, Mar. 18, 1988, abandoned.

[30] Foreign Application Priority Data

Mar. 20, 1987 [JP] Japan ................................. 62-67647
Apr. 2, 1987 [JP] Japan ................................. 62-81817

[51] Int. Cl.$^5$ ............................................. H01L 39/12
[52] U.S. Cl. ................................. 505/430; 164/462; 164/459; 505/740; 505/739; 505/450
[58] Field of Search ........... 264/211.11, 210.8, 211.14, 264/211.17, 82; 501/95; 505/1, 725, 740, 739; 164/462, 473, 459

[56] References Cited

U.S. PATENT DOCUMENTS

| | | | |
|---|---|---|---|
| 3,347,959 | 10/1967 | Engelke et al. | 264/211.14 X |
| 4,185,981 | 1/1980 | Ohsato et al. | 264/211.14 X |
| 4,826,808 | 5/1989 | Yurek et al. | 427/62 X |
| 4,861,751 | 8/1989 | Tenhover | 427/62 X |
| 4,865,664 | 9/1989 | Sato et al. | 148/403 |
| 4,880,771 | 11/1989 | Cava et al. | 505/1 |
| 4,956,338 | 9/1990 | Rapp et al. | 505/1 |
| 4,962,085 | 10/1990 | de Barbadillo et al. | 505/1 |
| 4,985,400 | 1/1991 | Choudhury | 505/1 |

OTHER PUBLICATIONS

Matsuzaki et al. "Preparation of a High $T_c$ Superconductor by Oxidation of an Amorphous $La_{1.8}Sr_{0.2}$ Cu Alloy Ribbon in Air," (Mar. 9, 1987).

Primary Examiner—Jan H. Silbaugh
Assistant Examiner—Christopher A. Fiorilla
Attorney, Agent, or Firm—Pennie & Edmonds

[57] ABSTRACT

A method of manufacturing a superconductive conductor containing a superconductive ceramic material generally expressed by the composition AaBbCc, where A represents at least a sort of element selected from a group of those belonging to the groups Ia, IIa and IIIb of the periodic table, B represent at least a single element selected from a group consisting of groups Ib, IIb and IIIa of the periodic table, C represents at least a single sort of element selected from a group of oxygen, carbon, nitrogen, fluorine and sulfur and a, b and c represent numbers showing composition ratios of A, B and C respectively, includes a step of melting a material generally expressed by a formula AaBb, a step of continuously drawing out a melt of AaBb from a hole provided in a frame, a step of solidifying the AaBb melt drawn out from the hole and a step of heating a solidified body of AaBb in an atmosphere containing C.

10 Claims, 1 Drawing Sheet

METHOD OF MANUFACTURING SUPERCONDUCTIVE CONDUCTOR

This is a continuation of application Ser. No. 07/170,205, filed Mar. 18, 1988, now abandoned.

BACKGROUND OF THE INVENTION

1. Field of the Invention

The present invention relates to a method of manufacturing a superconductive conductor, and more particularly, it relates to a method of manufacturing a superconductive conductor which is suitable for forming elongated superconducting wire for magnets or

2. Description of the Related Art

In recent years, a superconductive ceramic material showing a higher critical temperature has been studied. A superconductor of such a ceramic material is prepared by press-forming raw materials of ceramic powder and thereafter sintering the same. After the press forming, temporary firing may be performed in advance to glost firing.

In the conventional method performed by sintering the powder, it is extremely difficult to elongate the substance since the length thereof is restricted to that of a mold for the press forming. Thus, it has been difficult to apply the conventional superconductor to a device which can make the best use of its superconductivity such as a conductor for forming a coil for a high current density magnet or a long-distance transmission line. Furthermore, in the conventional method, complicated steps are required in order to manufacture an elongated body, leading to inferior productivity.

SUMMARY OF THE INVENTION

An object of the present invention is to provide a method of efficiently manufacturing an elongated superconductive conductor of a ceramic superconductive material.

The manufacturing method according to the present invention is characterized in that a raw material is partially heated to the molten state to be thereafter coupled with the remaining component under heating to form a ceramic superconductive material.

The present invention provides a method of manufacturing a superconductive conductor containing a ceramic superconductive material being in composition generally expressed by a formula $A_aB_bC_c$, where A represents at least a single element selected from a group consisting of elements belonging to the groups IA, IIa and IIIb of the periodic table, B represents at least a single element selected from a group of those belonging to the groups Ib, IIb and IIIa of the periodic table, C represents at least a single element selected from a group of oxygen, carbon, nitrogen, fluorine and sulfur and a, b and c represent numbers showing composition ratios of A, B and C, and the method comprises the following steps:

First, a material generally expressed by a formula $A_aB_b$ is heated to form an $A_aB_b$ melt which is then continuously drawn out from a hole provided in a frame. The $A_aB_b$ melt which is drawn out from the hole is then solidified. Thereafter, the solidified body of $A_aB_b$ is heated in an atmosphere containing C.

As hereinabove described, a superconductive conductor obtained according to the present invention ID may be, for example, in the composition expressed by $A_aB_bC_c$, where A contains at least a single sort of element, preferably at least two elements selected from a group consisting of elements belonging to the groups Ia, IIa and IIIb of the periodic table. The elements belonging to the group Ia of the periodic table are H, Li, Na, K, Rb, Cs and Fr. The elements belonging to the group IIa are Be, Mg, Ca, Sr, Ba and Ra. The elements belonging to the group IIIb are Sc, Y, La, Ce, Pr, Nd, Pm, Sm, Eu, Gd, Tb, Dy, Ho, Er, Tm, Yb, Lu, Ac, Th, Pa, U, Np, Pu, Am, Cm, Bk, Cf, Es, Fm, Md, No and Lr.

B represents at least a single element selected from the group consisting of the elements belonging to the groups Ib, IIb and IIIa of the periodic table.

The elements belonging to the group Ib of the periodic table are Cu, Ag and Au, and the elements belonging to the group IIb are Zn, Cd and Hg, while the elements belonging to the group IIIA are B, Al, Ga, In and Tl.

Examples of the atmosphere containing C are those containing oxygen or nitrogen, a carbon monoxide atmosphere, a carbon dioxide atmosphere and a hydrogen sulfide atmosphere.

According to the present invention, the material $A_aB_b$ when cooled and solidified substantially forms an alloy state which is flexible. Therefore, the material $A_aB_b$ thus cooled and solidified is superior o in workability to ceramics. Thus, a superconductive conductor can be easily obtained in any chosen final configuration by forming the material $A_aB_b$ into such a configuration during the cooling/solidification stage.

The raw material $A_aB_b$ employed in the present invention hardly reacts with a part or an apparatus such as a crucible, with which the raw material is brought into contact during manufacturing. Thus, as compared with $A_aB_bC_c$ in general, the melting/solidification method can be easily carried out industrially.

Further, $A_aB_b$ is generally superior in thermal conductivity to $A_aB_bC_c$, whereby it is possible to increase the speed for drawing out the same in a molten state.

In a preferred embodiment according to the present invention, a material generally expressed by a formula $A_aB_b$ is heated to the molten state and is drawn out through a hole provided in a frame at a high temperature exceeding the melting point of $A_aB_b$. A conductor having a circular section, a deformed conductor or a strip-shaped conductor can be easily obtained by selecting the configuration of the frame, i.e., the sectional configuration of the hole for passing a melt of $A_aB_b$.

The $A_aB_b$ melt thus drawn out may be solidified by forcible cooling or standing under ambient conditions.

The $A_aB_b$ solidified body may be heated in an atmosphere containing C using the same source of heat for melting $A_aB_b$ itself. Thus, it is not necessary to re-heat the same by another heating means. In this case, the atmosphere containing C is preferably provided adjacent to the high-temperature frame, so that C can be more efficiently coupled to $A_aB_b$.

The $A_aB_b$ solidified body may be temporarily cooled to be not more than a prescribed temperature and then re-heated and coupled with C under the atmosphere containing C.

The $A_aB_b$ solidified body is preferably solidified to provide a unidirectional solidified member or a monocrystal member, whereby a superconductive conductor having excellent superconductivity may be obtained.

Further, preferably at least copper is contained as B and at least oxygen is contained as C in the aforementioned composition formula, in order to increase the critical temperature.

According to this embodiment, an elongated body of an arbitrary sectional configuration can be drawn out with relatively small force by employing the high-temperature frame as hereinabove described.

When the AaBb solidified body is provided as a unidirectional solidified member or a monocrystal body, more effective use of superconductivity may be made. Such a unidirectional solidified member or monocrystal body can be easily obtained by drawing out the AaBb melt through the high-temperature frame.

Further, according to this embodiment, by devising the sectional configuration of the high-temperature frame the melt which is drawn out through the frame at a high temperature conform to an elongated body having various sectional configurations. Thus, such a method can provide a superconductive conductor in the form of a fine wire or a tape-like superconductive conductor. An elongated superconductive conductor can therefore be efficiently produced with no complicated mold or apparatus and through no troublesome steps.

Thus, it is possible to industrially produce an elongated superconductive conductor applicable to long-distance transmission lines or coils for high current density magnets, which can make the most effective use of superconductivity.

It is noted that the inventive manufacturing method is also applicable to the manufacturing of a superconductive conductor in a form other than elongated body.

In another preferred embodiment of the present invention, the material AaBb is molten and drawn out through a hole provided in a frame and then immediately brought into contact with a cooling medium to be cooled and solidified. Thereafter the substance is heated in an atmosphere containing C.

In the aforementioned step, the cooling medium is preferably a liquid such as water. Further, the product of the said cooling and solidifying step is preferably in an amorphous state, so that a deeper infiltration of C is facilitated in a later heating step or so that a superior flexibility is provided. The outer diameter or thickness of the substance after cooling and solidification is preferably selected to be not more than 100 $\mu$m, in order to facilitate infiltration of C as deep as possible in the later heating step, as well as to further stabilize a superconductive state of a superconductive conductor, which may be obtained without performing any specific working thereafter.

According to this embodiment, the material AaBb is molten and then drawn out into the cooling medium through the hole so as to be cooled and solidified into a prescribed configuration. AaBb is easily cooled and solidified since the same is generally superior in thermal conductivity compared to AaBbCc. Thus, AaBb can be easily and uniformly quenched and solidified in an amorphous state.

Further, AaBb hardly reacts with the ceramics of the crucible or a nozzle as compared with AaBbCc in general, and hence the AaBb can be easily industrially handled in a molten state. Thus, industrialization is advantageously facilitated.

In addition, AaBb can in the molten state be drawn into the cooling medium through the hole and cooled and solidified into an elongated form. The elongated substance is thereafter heated in an atmosphere containing C, so that a superconductive conductor containing a ceramics superconductive material can be easily obtained. Namely, an elongated wire, particularly a fine wire, or a thin tape-like substance can be easily obtained to further widen the range of application of such a superconductive conductor.

These and other objects, features, aspects and advantages of the present invention will become more apparent from the following detailed description of the present invention when taken in conjunction with the accompanying drawings.

DESCRIPTION OF THE PREFERRED EMBODIMENTS

Example 1

Figure 1:
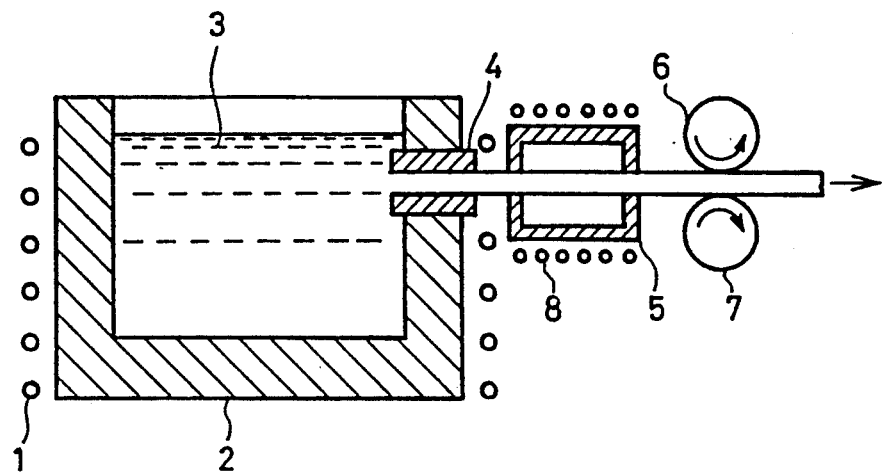
FIG. 1 is a sectional view schematically showing an apparatus employed for carrying out the first Example of the present invention.

An elongated superconductive conductor was obtained through an apparatus as shown in FIG. 1. Referring to FIG. 1, this apparatus has a crucible 2 provided on its exterior with a heater 1, a high temperature frame 4 provided in a side wall portion of the crucible 2, an oxygen atmosphere furnace 5 outwardly adjacent to the high temperature frame 4 and rolls 6 and 7 for drawing out a solidified body. The atmosphere furnace 5 is also provided with a heater 8 on its periphery.

$YBa_2Cu_3$ was heated in the crucible 2 to obtain a melt 3, which was then drawn out from the high temperature frame 4 of 1.0 mm in inner diameter and immediately passed through the oxygen atmosphere furnace 5 under oxygen partial pressure of 150 mmHg at a temperature of 800° C., thereby to obtain a ceramic elongated body of $YBa_2Cu_3O_{7-0}$. This ceramic elongated body exhibited superconductivity at 90K.

Example 2

Figure 2:
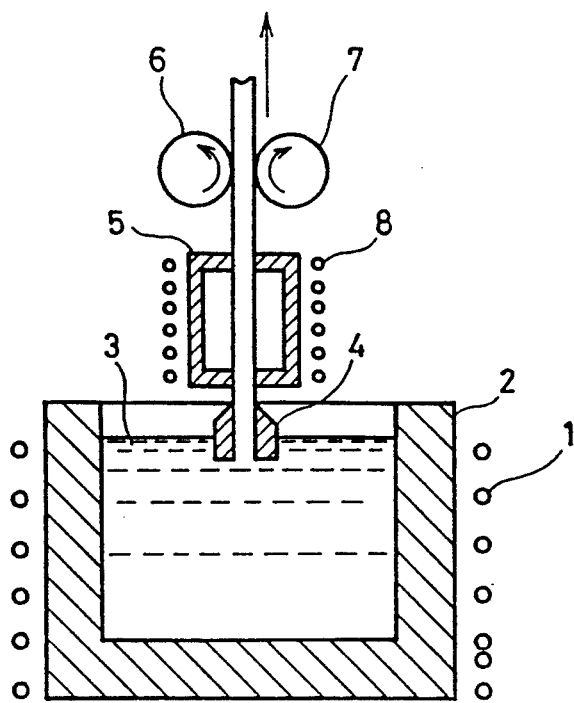
FIG. 2 is a sectional view schematically showing an apparatus employed for carrying out the second Example of the present invention.

An elongated ceramic superconductive conductor was prepared through an apparatus as shown in FIG. 2. Referring to FIG. 2, numeral 1 indicates a heater and numeral 2 indicates a crucible, while numeral 3 indicates a melt and numeral 4 indicates a high temperature frame provided on the melt 3. An oxygen atmosphere furnace 5 is provided above the high temperature frame 4, and a pair of rolls 6 and 7 are provided above the atmosphere furnace 5, to be rotated in directions shown by arrows in the figure for drawing out a solidified ceramics body. The atmosphere furnace 5 is also provided with a heater 8 on its periphery.

A material having the composition of $(La_{0.925}Sr_{0.075})_2Cu$ was heated to a molten state in the crucible 1 to be drawn out from the high temperature frame 4 having a passage portion of 0.5 mm in thickness and 10 mm in width and immediately passed through the oxygen atmosphere furnace 5 under oxygen partial pressure of 150 mmHg at a temperature of 780° C., thereby to obtain a ceramics body having layer perovskite structure of $(La_{0.925}Sr_{0.075})_2CuO_2$. This ceramics body exhibited superconductivity at 40K.

Example 3

$Y_{0.4}Ba_{0.6}Cu$ containing 0.7 atomic percent of Be as an impurity was heated to a molten state in a crucible and drawn out through a nozzle of 100 $\mu$m in pore diameter by Ar gas pressure into flowing water to be solidified in the form of a fine wire. This fine wire substance was then heated in a furnace under oxygen partial pressure of 200 Torr. at 1100° C. for two hours, to obtain a superconductive conductor containing a ceramic superconductive material of $BE_{0.007}Y_{0.4}Ba_{0.6}CuO_3$. This superconductive conductor exhibited superconductivity at 90K.

Example 4

$La_{1.66}Sr_{0.34}Cu$ was heated to a molten state in a crucible to prepare a tape-like body of 30 μm in thickness and 60 mm in width by the so-called roll quench method. This tape-like body was then heated in a furnace of 1000° C. under oxygen partial pressure of 200 Torr. for two hours, to obtain a superconductive conductor containing a ceramic superconductive material having a layer perovskite structure of $La_{1.66}Sr_{0.34}CuO_4$. This superconductive conductor exhibited superconductivity at 30K.

Example 5

$Bi_2Sr_2Ca_2Cu_2$ was heated to a molten state in a crucible to prepare a tape-like body of 100 μm in thickness and 5 mm in width by the so-called roll quench method. This tape-like body was then heated in a furnace of 830° C. under oxygen pressure of 1 atm. for two hours, to obtain a superconductive conductor containing a ceramic superconductive material having a layer structure of $Bi_2Sr_2Ca_2Cu_3O_x$. This superconductive conductor exhibited superconductivity at 105K.

Although the present invention has been described and illustrated in detail, it is clearly understood that the same is by way of illustration and example only and is not to be take by way of limitation, the spirit and scope of the present invention being limited only by the terms of the appended claims.

What is claimed is:

1. A method of manufacturing a superconductive conductor formed by a ceramic superconductive material having a composition generally expressed by a formula AaBbCc, where A represents at least an element selected from the group consisting of Ia, IIa and IIIb of the periodic table, B represents at least copper, C represents at least oxygen and a, b and c represent numbers showing composition ratios of A, B and C respectively, said method comprising:

a step of melting a material generally expressed by a formula AaBb in a frame, where A, B, a and b represent those described above and wherein said AaBb when coupled with said Cc is capable of forming a superconductor;

a step of continuously drawing out a melt of AaBb through a hole provided in said frame;

a step of solidifying by forcible cooling or standing under ambient conditions said AaBb melt drawn out from said hole; and a step of heating to at least 700° C. a solidified body of said AaBb in an atmosphere containing said C wherein said AaBb is coupled with said C to form a superconductive conductor.

2. A method of manufacturing a superconductive conductor in accordance with claim 1, wherein said drawing out step comprises a step of heating said frame to a high temperature exceeding the melting point of said AaBb.

3. A method of manufacturing a superconductive conductor in accordance with claim 2, wherein said AaBb solidified body is either a unidirectional solidified member or a monocrystal body.

4. A method of manufacturing a superconductive conductor in accordance with claim 2, wherein the heat for said step of heating a solidified body of said AaBb in an atmosphere containing C is supplied by the same source of heat for said step of melting said AaBb.

5. A method of manufacturing a superconductive conductor in accordance with claim 4, wherein said atmosphere containing said C is adjacent to said frame.

6. A method of manufacturing a superconductive conductor in accordance with claim 2, wherein said AaBb solidified body is re-heated to be coupled with said C under said atmosphere containing said C.

7. A method of manufacturing a superconductive conductor in accordance with claim 1, wherein said solidifying step comprises a step of bringing said AaBb melt obtained in said drawing out step into contact with a cooling medium.

8. A method of manufacturing a superconductive conductor in accordance with claim 7, wherein said cooling medium is a liquid.

9. A method of manufacturing a superconductive conductor in accordance with claim 7, wherein said AaBb solidified body is in an amorphous state after cooling and solidification.

10. A method of manufacturing a superconductive conductor in accordance with claim 7, wherein the outer diameter or thickness of said solidified body of said AaBb is not more than 100 μm.

* * * * *